United States Patent [19]
Sugawara

[11] Patent Number: 5,357,123
[45] Date of Patent: Oct. 18, 1994

[54] LIGHT EMITTING DIODE ARRAY WITH DOVETAIL

[75] Inventor: Satoru Sugawara, Natori, Japan

[73] Assignees: Ricoh Company, Ltd., Tokyo; Ricoh Research Institute of General Electronics Co., Ltd., Natori, both of Japan

[21] Appl. No.: 57,482

[22] Filed: May 3, 1993

[30] Foreign Application Priority Data

May 14, 1992 [JP] Japan ................... 4-122190
Feb. 18, 1993 [JP] Japan ................... 5-029271

[51] Int. Cl.⁵ .............................. H01L 33/00
[52] U.S. Cl. ............................ 257/88; 257/92; 257/95; 257/627; 257/628; 372/49
[58] Field of Search .............. 257/92, 88, 89, 90, 257/93, 622, 623, 627, 628, 926, 95; 372/49, 50

[56] References Cited

U.S. PATENT DOCUMENTS 3,457,633  7/1969  Marinace et al. ............ 257/88 X
3,900,864  8/1975  Dapkus et al. .............. 257/92 X
4,032,944  6/1977  Van Dongen et al. ......... 257/88
4,171,234  10/1979 Nagata et al. ............. 257/628 X
5,260,588  11/1993 Ohta et al. ............... 257/93

FOREIGN PATENT DOCUMENTS 0036032  1/1991  Japan.

*Primary Examiner*—William Mintel
*Attorney, Agent, or Firm*—Cooper & Dunham

[57] ABSTRACT

A light emitting diode array has light emitting dots arranged in a line and is characterized in that a semiconductor substrate of a chip constituting the light emitting diode array has a Dovetail grooved mesa shape on a chip end face opposed to an adjacent chip and arranged in a direction perpendicular to an arranging direction of light emitting diodes. A light emitting portion can be protected from chipping even when a length from the light emitting portion of the light emitting diode array to a chip end portion is shorter than the size of a chipping portion.

16 Claims, 9 Drawing Sheets

LIGHT EMITTING DIODE ARRAY WITH DOVETAIL

BACKGROUND OF THE INVENTION

1. Field of the Invention

The present invention relates to a light emitting diode array used for light sources of an optical printer, a facsimile telegraph, etc. More particularly, the present invention relates to a light emitting diode array in which chip end faces are opposed to each other so as to arrange light emitting dots in a line.

2. Description of the Related Art

An electrophotographic system is widely used in a general digital office automation (OA) equipment such as a printer, a facsimile telegraph, etc. A laser diode and a light emitting diode array are used as a light source of the digital OA equipment. In particular, the light emitting diode array is suitable for the electrophotographic system operated at a high speed and having a wide width. The light emitting diode array is researched and developed as a light source of the optical printer having high performance.

Figure 8:
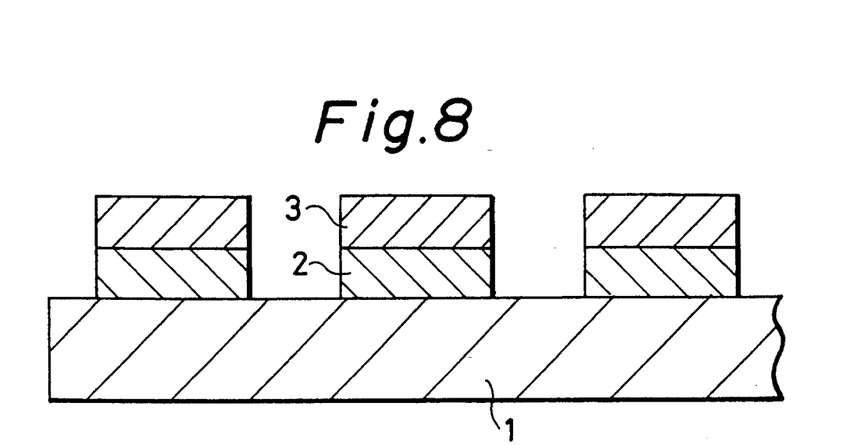
FIG. 8 is a schematic view showing the structure of a chip in a general light emitting diode array.

FIG. 8 shows a general structure of the light emitting diode array. For example, in this structure, light emitting portions are composed of an n-type GaAs layer or an n-type AlGaAs layer 2 and a p-type GaAs layer or a p-type AlGaAs layer 3 are formed on an n-type GaAs substrate 1 so as to be spaced from each other at an equal distance.

Figure 9:
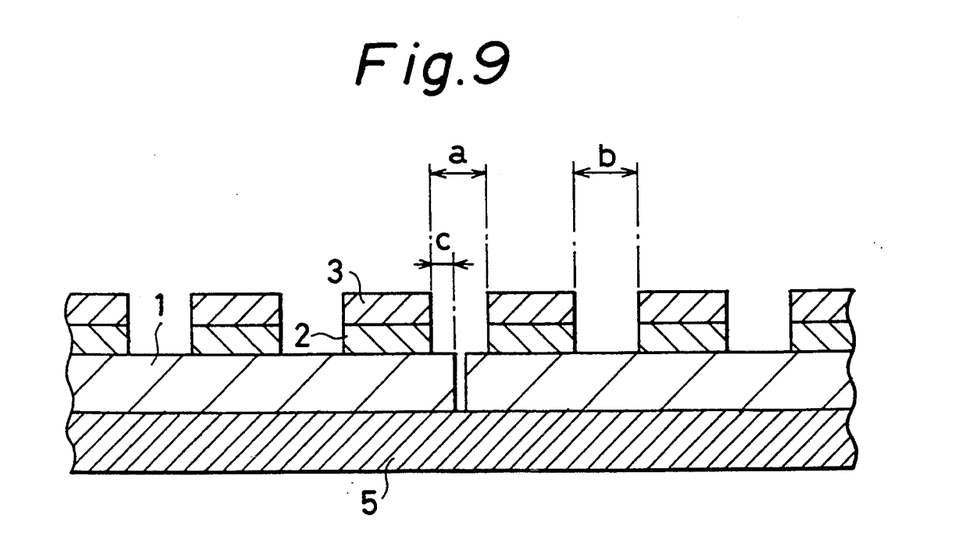
FIG. 9 is a schematic view showing a state in which chips in the light emitting diode array shown in FIG. 8 are arranged.

A plurality of chips of the light emitting diode array having such a structure are arranged such that chip end faces are opposed to each other. Thus, a size of the light emitting diode array is increased by arranging the plural light emitting diode array chips in a line. For example, as shown in FIG. 9, when the light emitting diode array is fabricated as a light source of a printer, a plurality of chips of the light emitting diode array are adhered to each other by a conductive adhesive on a die bonding substrate 5 so as to increase the size of the light emitting diode array. In this case, the chips of the light emitting diode array must be arranged such that a clearance a between outside light emitting portions at separate chip ends is equal to a clearance b between inside light emitting portions within each of the chips so as not to reduce a printing quality between these chips. To arrange the chips in this way, a length c from an outside light emitting portion to a chip end portion must be equal to or smaller than a length half the clearance b between the inside light emitting portions.

Figure 10:
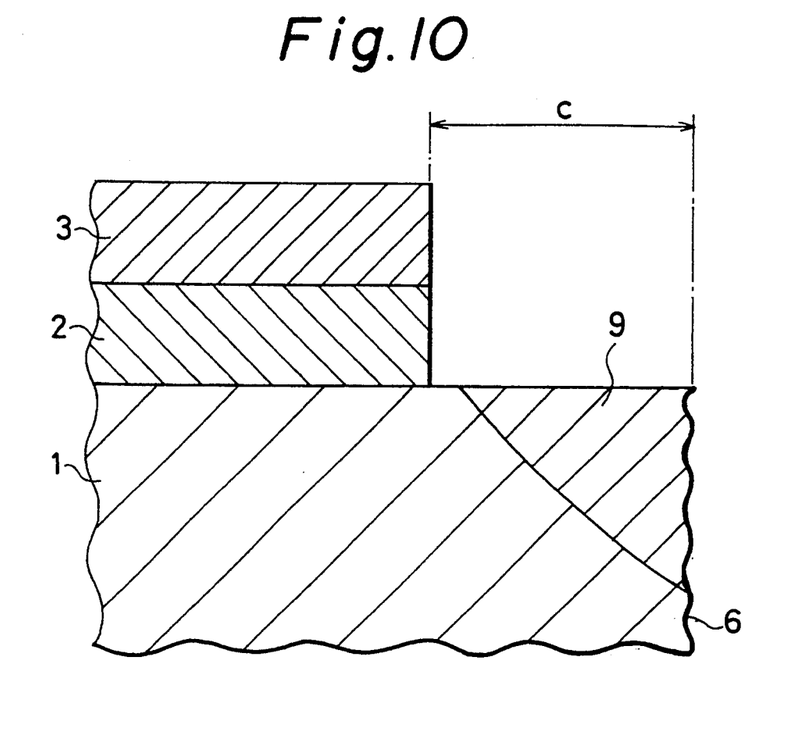
FIG. 10 is a cross-sectional view of an element end portion having a chipping portion caused by dieing the chips in the light emitting diode array shown in FIG. 8.

Recently, the clearance b between the inside light emitting portions is very reduced as the light emitting diode array is fabricated with high density. In particular, it is necessary to set the clearance b between the inside light emitting portions to an especially small value so as to realize a light emitting diode array having a high density and a high output. In this case, the clearance b between the inside light emitting portions within each of the chips of the light emitting diode array can be reduced in principle until a length provided at an accuracy level of photolithography. However, it is very difficult to set the length c from the outside light emitting portion to the chip end portion to be equal to or smaller than a length half the clearance b between the inside light emitting portions since there is a mechanical limit with respect to a dieing technique for cutting the chips. In particular, in a compound semiconductor of GaAs, etc., a chipping portion having a size from several $\mu m$ to several ten $\mu m$ is caused at a dieing time of the chips. FIG. 10 is a cross-sectional view of an element end portion having a chipping portion 9 caused at the dieing time of a chip of the light emitting diode array at an end thereof. In FIG. 10, reference numeral 6 designates a cross section of the chipping portion 9 formed at the dieing time. To protect a light emitting portion from this chipping portion 9, a length c from the light emitting portion to a chip end portion must be set to be longer than a size of the chipping portion 9. This condition about the length c prevents a light emitting diode array having a high density from being realized.

Figure 11:
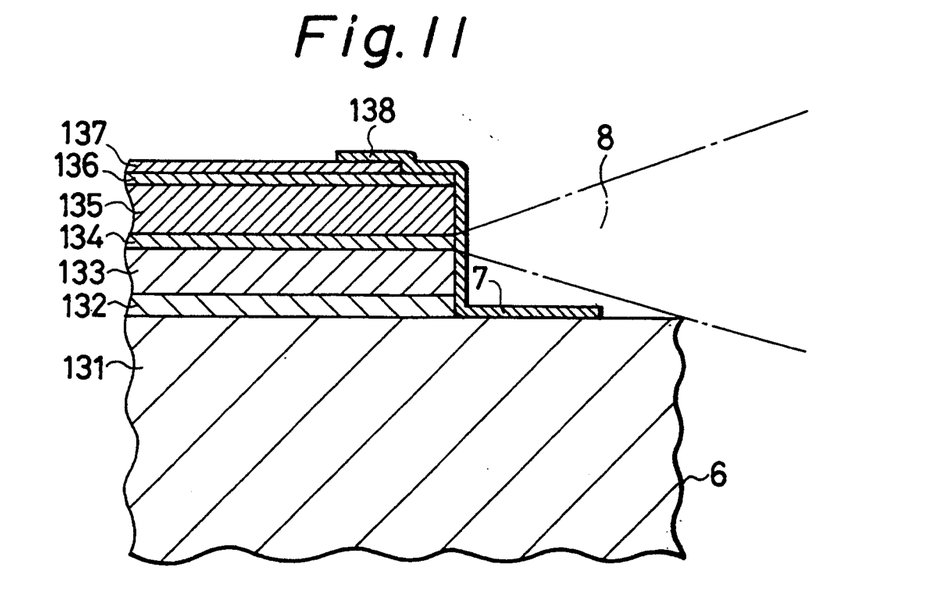
FIG. 11 is a view for explaining problems of a general light emitting diode array of an edge emitting type.

In a light emitting diode array of an edge emitting type in which, a light emitting portion is composed of a light emitting diode of an edge emitting type, not only a densification of this diode array is prevented but also the uniformity of a light output is reduced in accordance with an accuracy in dieing and the generation of chipping. FIG. 11 shows a cross-sectional shape of a general light emitting diode array of an edge emitting type in a direction perpendicular to an arranging direction of light emitting diodes. In the light emitting diode array of an edge emitting type shown in FIG. 11, an n-type GaAs buffer layer 132 is formed on an n-type GaAs substrate 131. Further, an n-type $Al_{0.4}Ga_{0.6}As$ clad layer 133, an $Al_{0.2}Ga_{0.8}As$ active layer 134 and a p-type $Al_{0.4}Ga_{0.6}As$ clad layer 135, so-called double hetero structure, are sequentially formed on the n-type GaAs buffer layer 132. A p-type GaAs cap layer 136 is further formed on the clad layer 135. Reference numerals 137 and 138 respectively designate a metallic electrode for injecting an electric current and an electrically insulated film. Reference numerals 6 and 8 respectively designate a cutting face of the substrate 131 cut by dieing and light emitted from a light emitting edge. A portion of this emitted light 8 is interrupted by a terrace-shaped portion 7 formed between the light emitting edge and a died portion so that this light portion cannot be used as a light output.

This terrace-shaped portion 7 in the general light emitting diode array of an edge emitting type is formed by dieing. Accordingly, there are dispersion in mechanical accuracy in dieing between chips and dispersion in cutting shape of each of the chips caused by chipping within each of the chips. Accordingly, no light output of a light emitting diode is uniformly influenced by the terrace-shaped portion 7 within a chip and a wafer. Therefore, the light output of the light emitting diode is dispersed by this terrace-shaped portion 7 even when the light output of the light emitting diode is uniformly provided in the light emitting diode array of an edge emitting type.

Accordingly, it is difficult to realize a light emitting diode array of an edge emitting type having a uniform light output so that such a light emitting diode array has not been practically used sufficiently.

Further, light of the light emitting diode array of an edge emitting type is emitted in a direction parallel to a substrate surface so that no light output can be measured in a wafer state. Therefore, the light output is measured with respect to each of separate elements after dieing. Hence, it takes much time and labor to measure the light output in this way so that no light emitting diode array of an edge emitting type has not been practically used sufficiently.

SUMMARY OF THE INVENTION

It is therefore an object of the present invention to provide a light emitting diode array having a high density in which a light emitting portion can be protected from chipping even when a length from the light emitting portion of the light emitting diode array to a chip end portion is shorter than the size of a chipping portion.

Another object of the present invention is to provide a light emitting diode array of an edge emitting type in which the diode array can be mounted with high density and the uniformity of a light output is improved and the light output can be measured in a wafer state.

The above objects of the present invention can be achieved by a light emitting diode array having light emitting dots arranged in a line and characterized in that a semiconductor substrate of a chip constituting the light emitting diode array has a Dovetail grooved mesa shape on a chip end face opposed to an adjacent chip and arranged in a direction perpendicular to an arranging direction of light emitting diodes.

The Dovetail grooved mesa shape formed in the light emitting diode array has an angle reflecting a crystal property.

In the present invention, plural light emitting diode arrays each having light emitting dots arranged in a line are especially arranged in a line and are used for a light source for an optical printer. In this case, a semiconductor substrate of a chip constituting each of the light emitting diode arrays has a Dovetail grooved mesa shape on a chip end face in a direction perpendicular to an arranging direction of light, emitting diodes and has a V grooved mesa shape in the arranging direction of the light emitting diodes. The Dovetail grooved mesa shape and the V grooved mesa shape are respectively formed simultaneously by a wet etching method or a dry etching method.

A construction and an operation of the light emitting diode array in the present invention will next be described when the Dovetail grooved mesa shape is formed by using the wet etching method.

A compound semiconductor substrate of GaAs, InP, GaP, etc. forming the light emitting diode array has a zinc-blende structure as a crystal structure. Accordingly, an etching shape of the substrate is anisotropic with respect to a specified etching liquid. For example, when the substrate has a (100) face and the etching liquid is a sulfuric acid etching liquid, no etching operation can be easily performed on a (111) A-face approximately having an angle of 54.7 degrees with respect to the (100) face in comparison with the other crystal faces. Accordingly, the etching operation is selectively performed.

When $<01\bar{1}> = <01\bar{1}>$ is set, a chip end is formed in a V grooved mesa shape in a direction of $<011>$ and is formed in an Dovetail grooved mesa shape in a direction of $<01\bar{1}>$. If the chip end of the light emitting diode array is formed in the Dovetail grooved mesa shape by using this directional property, it is possible to prevent elements from being damaged by chipping by a cutting length inside the chip cut in the Dovetail grooved mesa shape. In this case, a chipping size depends on a substrate material and a dieing method. For example, when a GaAs substrate is used, a chipping portion having a size from several $\mu$m to several ten $\mu$m is generally formed. To prevent such a chipping portion from being formed, the cutting length inside the chip cut in the Dovetail grooved mesa shape is set to be greater than the chipping size. The cutting length is selectively set in accordance with dieing method and condition and a substrate material. For example, if the cutting length inside the chip cut in the Dovetail grooved mesa shape is set to about 20 $\mu$m, it is sufficient to perform wet etching about a length of $20 \times \tan(54.7) \approx 30$ $\mu$m in a depth direction of the chip. Thus, no chipping, etc. are caused in a light emitting portion even when a chipping portion having a size greater than a length from the light emitting portion to a chip end portion is caused at a dieing time. Accordingly, the length from the light emitting portion to the chip end portion can be set to be shorter than the chipping size. Thus, it is possible to realize a light emitting diode array having a high density which cannot be generally fabricated easily.

When the V grooved mesa shape is formed by the wet etching method in an arranging direction of light emitting diodes in a light emitting diode array of an edge emitting type in the present invention, a portion of light emitted from a light emitting edge is interrupted by a chip portion forming the V grooved mesa shape. However, this V grooved mesa portion can be precisely formed by photolithography so that a light output of each of the light emitting diodes is uniformly influenced by the V grooved mesa portion within a chip and a wafer. Thus, it is possible to solve the general problems about dispersion in light output of each of the light emitting diodes caused in the light emitting diode array of an edge emitting type even when this light output is uniformly provided. Further, if the above etching operation is performed in a wafer state, a portion of light emitted in parallel with a substrate surface is reflected on a V grooved mesa face of a chip of the light emitting diode array adjacent onto the light emitting edge. The light portion can be taken out as monitor light in a direction approximately perpendicular to the substrate surface. Accordingly, the light output of the light emitting diode array of an edge emitting type can be measured in the wafer state although this light output can be generally measured only after dieing.

In the present invention, plural light emitting diode arrays each having light emitting dots arranged in a line are especially arranged in a line and are used for a light source for an optical printer. In this case, a semiconductor substrate of a chip constituting each of the light emitting diode arrays has a Dovetail grooved mesa shape on a chip end face in a direction perpendicular to an arranging direction of light emitting diodes. The Dovetail grooved mesa shape is formed by a wet etching method or a dry etching method. Thus, no chipping, etc. are caused in a light emitting portion even when a chipping portion having a size greater than a length from the light emitting portion to a chip end portion is caused at a dieing time. Accordingly, the length from the light emitting portion to the chip end portion can be set to be shorter than the chipping size. Thus, it is possible to realize a light emitting diode array having a high density which cannot be generally fabricated.

In the light emitting diode array of an edge emitting type in the present invention can be fabricated with high density. Further, a terrace-shaped chip portion in front of a light emitting edge can be precisely formed in a V grooved mesa shape by wet etching or dry etching, thereby improving the uniformity of a light output. Similarly, a portion of emitted light is reflected on a V grooved mesa face of a chip of the light emitting diode array adjacent onto the light emitting edge. The light portion can be taken out as monitor light in a direction approximately perpendicular to a substrate surface. Accordingly, the light output of the light emitting diode array can be measured in a wafer state by measuring this light portion. Thus, the light emitting diode array of an edge emitting type having a high density can be uniformly fabricated and the light output can be measured in the wafer state although it is difficult to generally fabricate such a light emitting diode array.

Further objects and advantages of the present invention will be apparent from the following description of the preferred embodiments of the present invention as illustrated in the accompanying drawings.

DESCRIPTION OF THE PREFERRED EMBODIMENTS

The preferred embodiments of a light emitting diode array in the present invention will next be described in detail with reference to the accompanying drawings.

Embodiment 1

Figure 1:
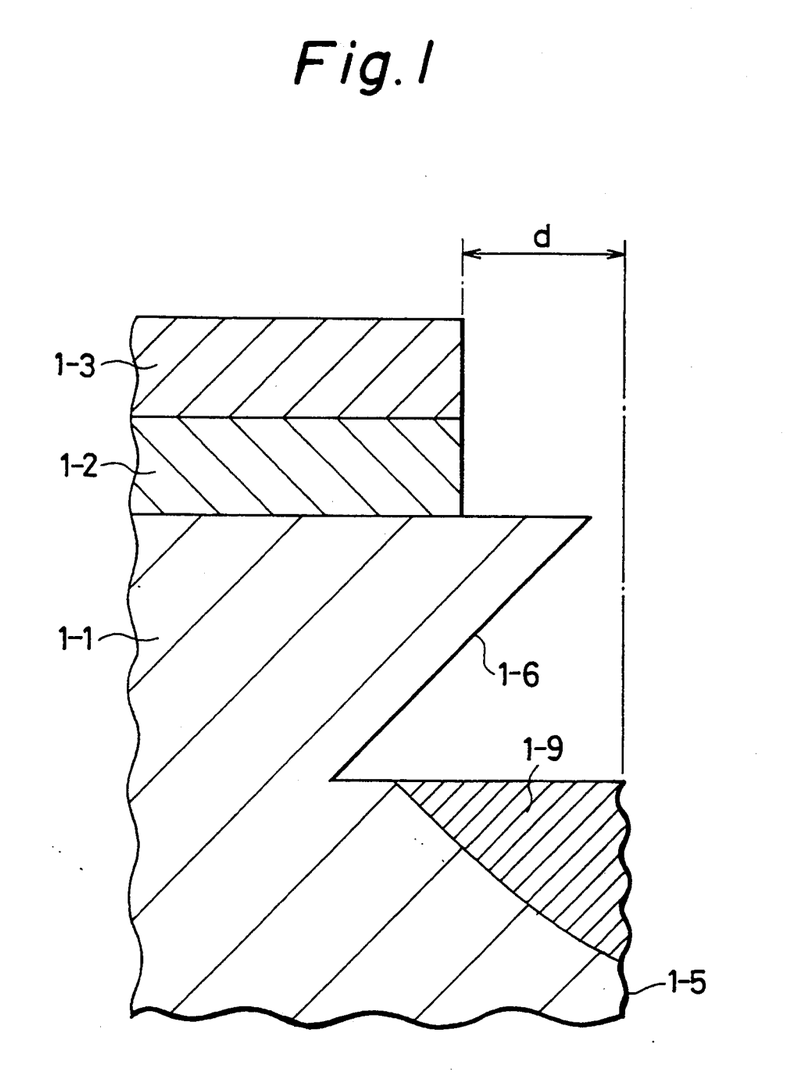
FIG. 1 is a cross-sectional view of an element end portion of a chip in a light emitting diode array in accordance with a first embodiment of the present invention.

FIG. 1 is a cross-sectional view showing a light emitting diode array in accordance with a first embodiment of the present invention. FIG. 1 shows an element end portion of a chip in the light emitting diode array. In FIG. 1, the light emitting diode array has a structure in which a light emitting portion composed of an n-type GaAs layer 1-2 and a p-type GaAs layer 1-3 is formed on an n-type GaAs substrate 1-1 with an equal clearance. In FIG. 1, reference numeral 1-5 designates a cutting face of the chip cut by dieing and reference numeral 1-9 is a chipping portion formed at a dieing time. A slanting face 1-6 is a Dovetail grooved mesa face formed by a wet etching method in the present invention. In this case, no chipping, etc. are caused in the light emitting portion even when a chipping portion having a size greater than a length d from the light emitting portion to a chip end is formed at the dieing time. Accordingly, the length d from the light emitting portion to the chip end can be set to be shorter than the size of the chipping portion.

Figure 2A:
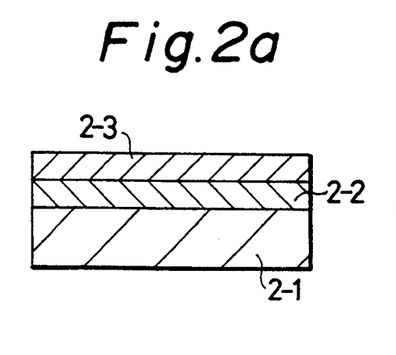
FIGS. 2a to 2d are views for explaining fabricating processes of the light emitting diode array shown in FIG. 1.
Figure 2B:
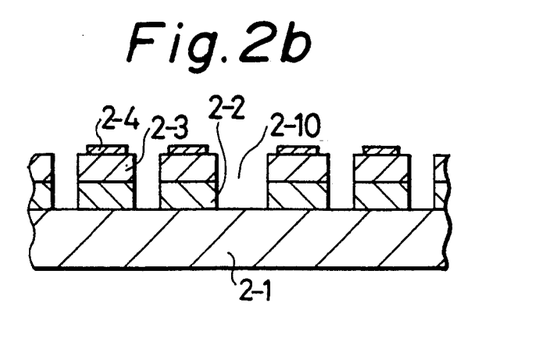
Figure 2C:
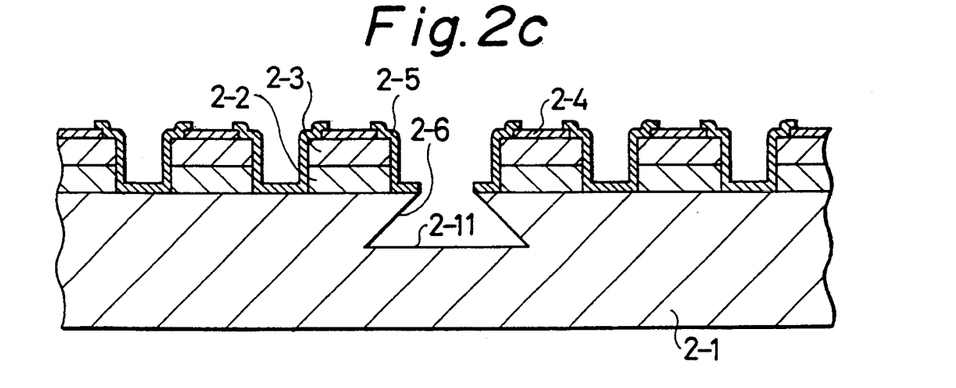
Figure 2D:
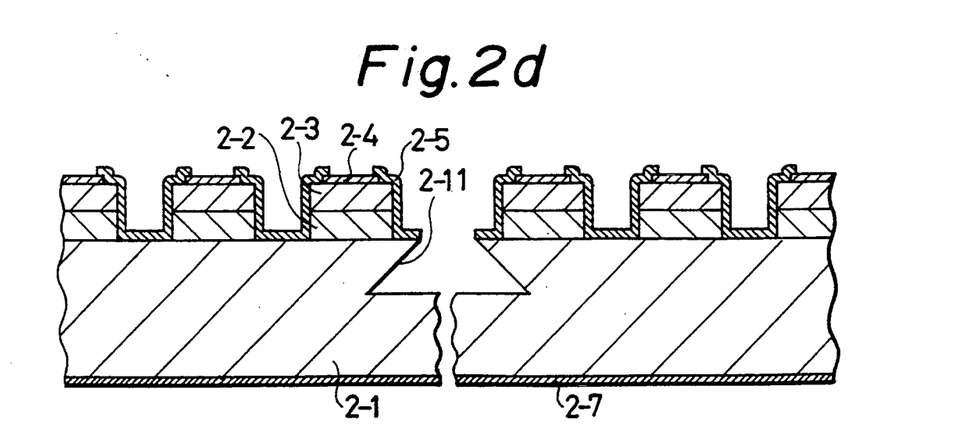

FIGS. 2a to 2d are process views showing one example of a method for fabricating the light emitting diode array in the first embodiment. As shown in FIG. 2a, an n-type GaAs layer 2-2 and a p-type GaAs layer 2-3 are epitaxially grown on an n-type GaAs substrate 2-1 by an LPE method. As shown in FIG. 2b, a p-type electrode 2-4 composed of Au-Zn/Au is next formed. Thereafter, a separate groove 2-10 is formed by dry etching using RIE until a substrate surface to electrically separate elements from each other. As shown in FIG. 2c, a passivation film 2-5 of SiO$_2$ having a thickness of 0.5 μm is then formed. This passivation film 2-5 is used as a mask and wet etching is performed for ten minutes at a temperature of 50° C. by using an etching liquid composed of sulfuric acid, hydrogen peroxide and water having a ratio of 4:1:1. Thus, a Dovetail groove 2-6 having a depth of 30 μm is formed. As shown in FIG. 2d, an n-type electrode 2-7 composed of Au-Ge/Ni/Au is next formed on a rear face of the n-type GaAs substrate 2-1. Thereafter, a bottom portion 2-11 of the etched groove 2-6 is died to separate chips from each other in the light emitting diode array. In the light emitting diode array, the Dovetail grooved mesa shape can be formed by a wet etching method on a (100) face of the n-type GaAs substrate in a chip end portion in the light emitting diode array. For example, the light emitting diode array is formed such that light emitting diodes are arranged in a direction of <011>. The groove formed by the wet etching method is set to be sufficiently wider than the width of a dieing blade used at a dieing time such that no chip end portion in the light emitting diode array is damaged by this dieing blade at the dieing time.

Embodiment 2

Figure 3:
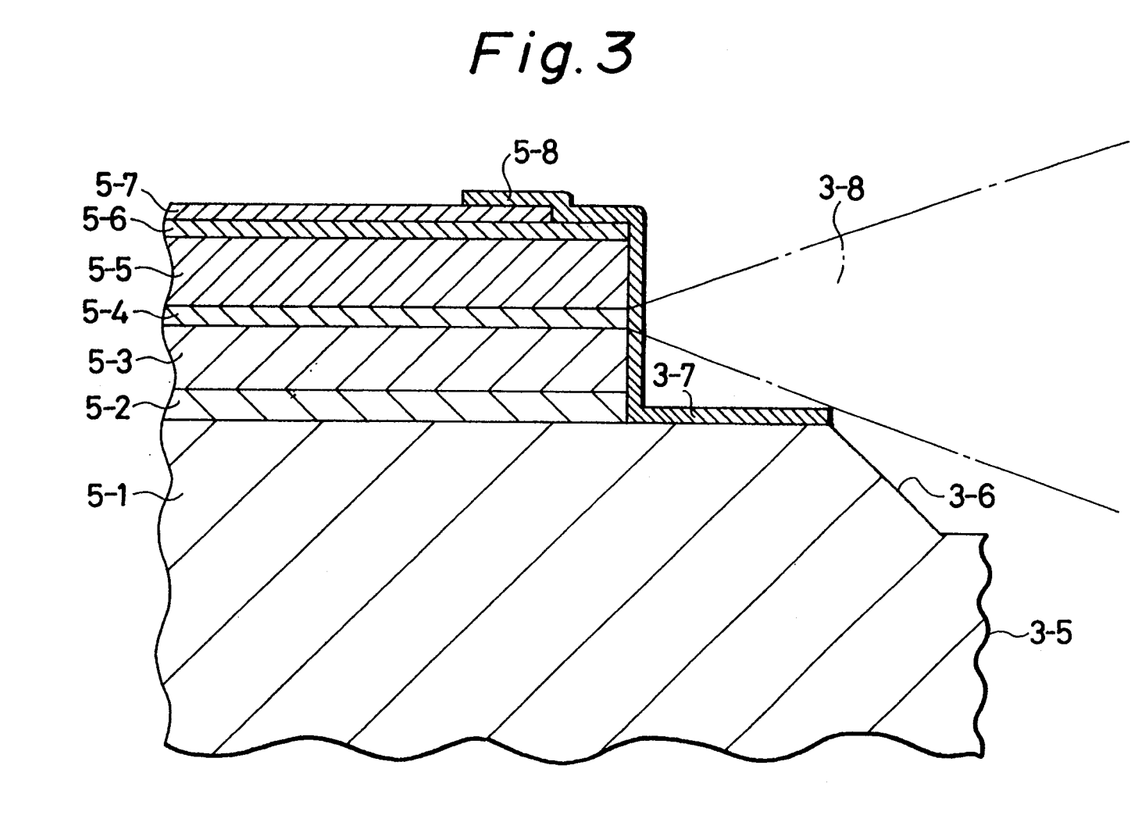
FIG. 3 is a cross-sectional view of an element end portion showing a cross-sectional shape of a chip of a light emitting diode array of an edge emitting type in a direction perpendicular to an arranging direction of light emitting diodes in accordance with a second embodiment of the present invention.

FIG. 3 shows a light emitting diode array of an edge emitting type in accordance with a second embodiment of the present invention. Similar to the first embodiment, in this light emitting diode array of an edge emitting type, an end portion of a chip in a direction perpendicular to an arranging direction of light emitting diodes is protected from chipping by forming this chip end portion in a Dovetail grooved mesa shape. FIG. 3 shows a cross-sectional shape of the chip of the light emitting diode array of an edge emitting type in the direction perpendicular to the arranging direction of the light emitting diodes. Reference numeral 3-5 designates a cutting face of a substrate 5-1 cut by dieing. A slanting face 3-6 is a substrate face formed in a V grooved mesa shape by the wet etching method in the present invention. Light 3-8 is emitted from a light emitting edge of a light emitting diode. In this case, a portion of this emitted light 3-8 is interrupted by a terrace-shaped portion 3-7 between the light emitting edge and the etched face 3-6 formed in the V grooved mesa shape. However, this terrace-shaped portion 3-7 can be precisely formed by photolithography. Accordingly, a light output of the light emitting diode is uniformly influenced by the terrace-shaped portion 3-7 within a chip and a wafer. Thus, uniformity of the light output of the light emitting diode in the light emitting diode array of an edge emitting type can be directly reflected as uniformity of the light output of this chip.

Figure 4:
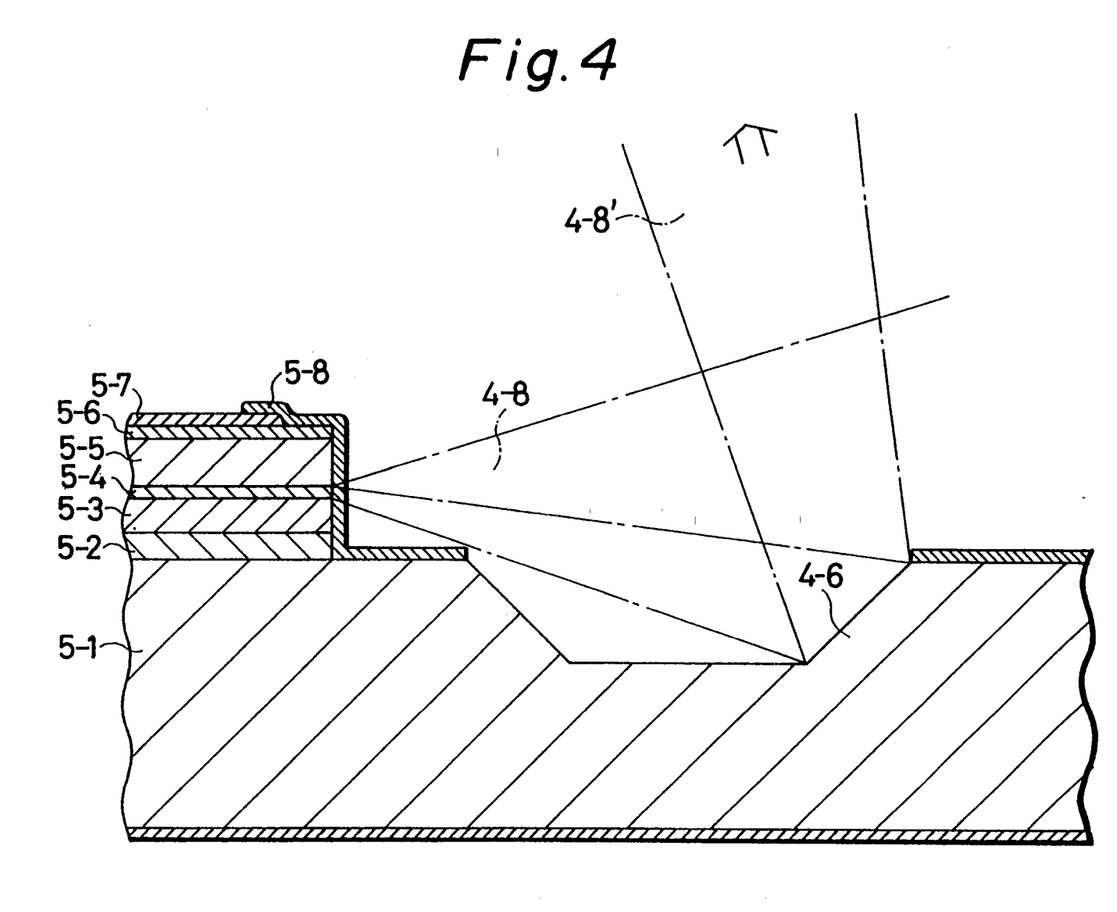
FIG. 4 is a view for explaining a method for measuring a light output of the light emitting diode array of an edge emitting type in the second embodiment of the present invention.

In the general light emitting diode array of an edge emitting type, a light output is measured only after chips are died. However, in the present invention, the light output can be measured in a wafer state. FIG. 4 shows a cross-sectional shape of a chip of the light emitting diode array of an edge emitting type in the present invention in a direction perpendicular to an arranging direction of light emitting diodes. Light 4-8 is emitted from a light emitting edge of the chip. A portion of this emitted light 4-8 is reflected on a V grooved mesa face 4-6 of the chip of the light emitting diode array adjacent onto a side of the light emitting edge and can be taken out as monitor light 4-8′ in a direction approximately perpendicular to a surface of a substrate 5-1. Accordingly, a light output can be measured in a wafer state by measuring this monitor light from the light emitting edge of the light emitting diode array of an edge emitting type.

Figure 5A:
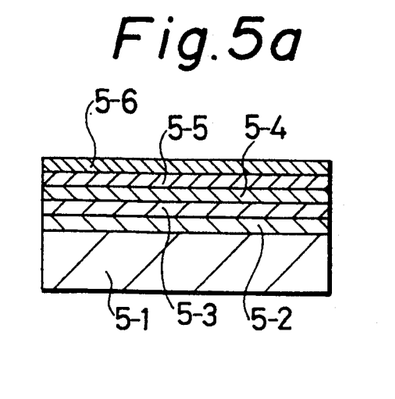
FIGS. 5a to 5d are views for explaining fabricating processes of the light emitting diode array of an edge emitting type shown in FIG. 3.
Figure 5B:
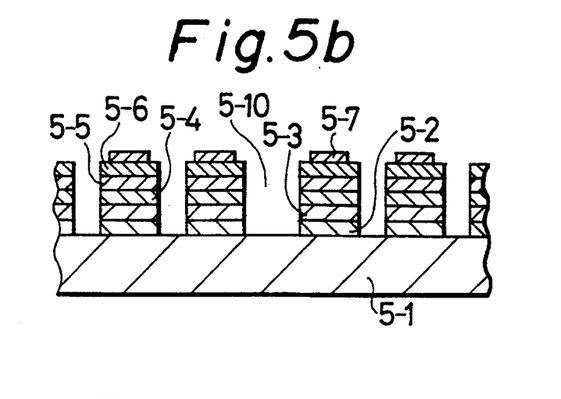
Figure 5C:
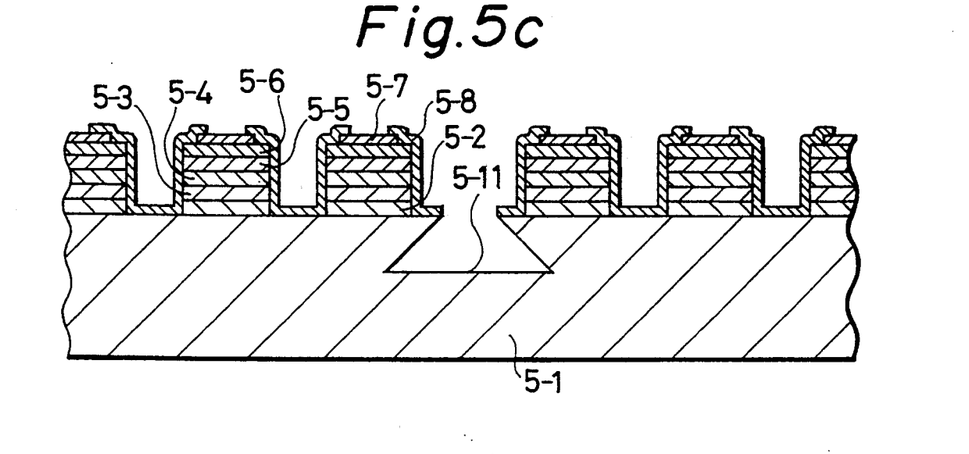
Figure 5D:
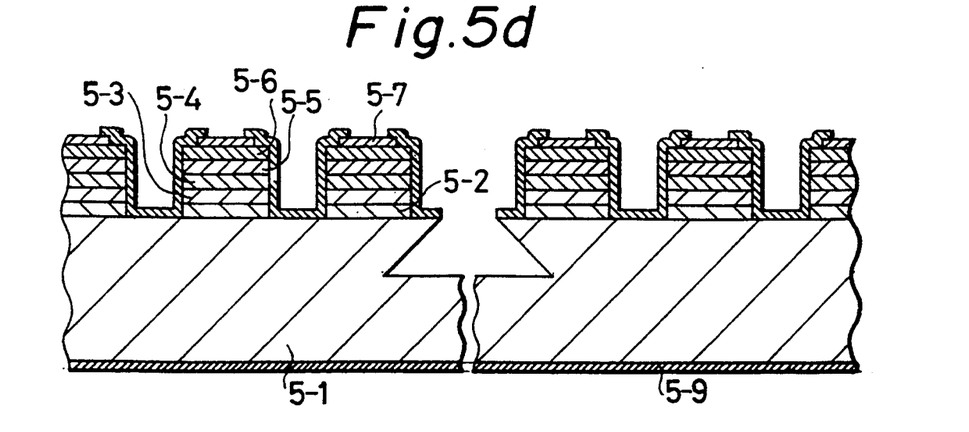

A method for fabricating the light emitting diode array of an edge emitting type in the second embodiment is basically similar to that in the above first embodiment. The differences between the first and second embodiments are that a double hetero structure is used as an epitaxial layer structure to provide a function of the light emitting diode array of an edge emitting type. FIGS. 5a to 5d show a method for fabricating the light emitting diode array of an edge emitting type. As shown in FIG. 5a, the double hereto structure is composed of an n-type GaAs buffer layer 5-2, an n-type $Al_{0.4}Ga_{0.6}As$ clad layer 5-3, an $Al_{0.2}Ga_{0.8}As$ active layer 5-4, a p-type $Al_{0.4}Ga_{0.6}As$ clad layer 5-5 and a p-type GaAs cap layer 5-6 sequentially formed on an n-type GaAs substrate 5-1. The double hetero structure composed of these five layers is epitaxially grown by a MOCVD method. As shown in FIG. 5b, a p-type electrode 5-7 composed of Au-Zn/Au is next formed. Thereafter, dry etching is then performed by using RIBE until a substrate surface to electrically separate elements from each other so that a separate groove 5-10 is formed. As shown in FIG. 5c, a passivation film 5-8 of $SiO_2$ having a thickness of 0.5 μm is then formed. This passivation film 5-8 is used as a mask and wet etching is performed for ten minutes at a temperature of 50° C. by using an etching liquid composed of sulfuric acid, hydrogen peroxide and water having a ratio of 4:1:1. Thus, a Dovetail groove 5-11 having a depth of 30 μm is formed. As shown in FIG. 5d, an n-type electrode 5-9 composed of Au-Ge/Ni/Au is next formed on a rear face of the n-type GaAs substrate 5-1. Thereafter, a bottom portion of the etched groove 5-11 is died to separate chips from each other in the light emitting diode array. In the light emitting diode array, a Dovetail grooved mesa shape of a light emitting portion can be formed by a wet etching method on a (100) face of the n-type GaAs substrate in a chip end portion in the light emitting diode array. For example, the light emitting diode array has a structure in which light emitting portions are formed with an equal clearance in a direction of <011>. Similar to the first embodiment, the groove formed by the wet etching method is set to be sufficiently wider than the width of a dieing blade used at a dieing time such that no chip end portion in the light emitting diode array is damaged by this dieing blade at the dieing time.

In the above first and second embodiments, when the mesa shape is formed on a chip end face of the light emitting diode array, wet etching is performed for ten minutes at the temperature of 50° C. by using the etching liquid composed of sulfuric acid, hydrogen peroxide and water having the ratio of 4:1:1. Thus, the mesa-shaped groove having a depth of 30 μm is formed. However, the wet etching can be performed for twelve minutes at a temperature of 7° C. by using an etching liquid composed of sulfuric acid, hydrogen peroxide and water having a ratio of 1:8:1. In this case, a mesa-shaped groove having a depth of 30 μm can be also formed. This etching liquid etches chips by reliably selecting a face azimuth of a crystal. In particular, this etching liquid is suitably used when the present invention is applied to a light emitting diode array having a high density such as 600 DPI(dot/inch), 1200 DPI, etc. Further, a Dovetail grooved mesa shape required in the present invention can be simply formed if the etching liquid is used such that an etched shape has an angle reflecting a crystal property.

Embodiment 3

In a third embodiment of the present invention, a Dovetail grooved mesa shape is formed by using a dry etching method. In this case, a shape and a function of the light emitting diode array in the present invention are similar to those in each of the above first and second embodiments. Accordingly, in this third embodiment, only a method for fabricating the light emitting diode array is shown in the following description when the Dovetail grooved mesa shape in the present invention is formed by using the dry etching method.

Figure 6A:
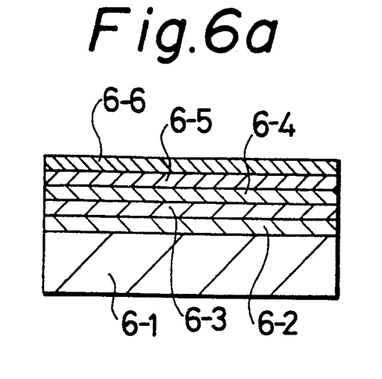
FIGS. 6a to 6d are views for explaining fabricating processes of a light emitting diode array in accordance with a third embodiment of the present invention.
Figure 6B:
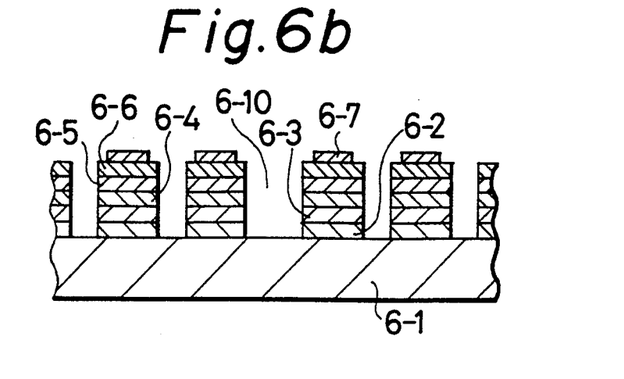
Figure 6C:
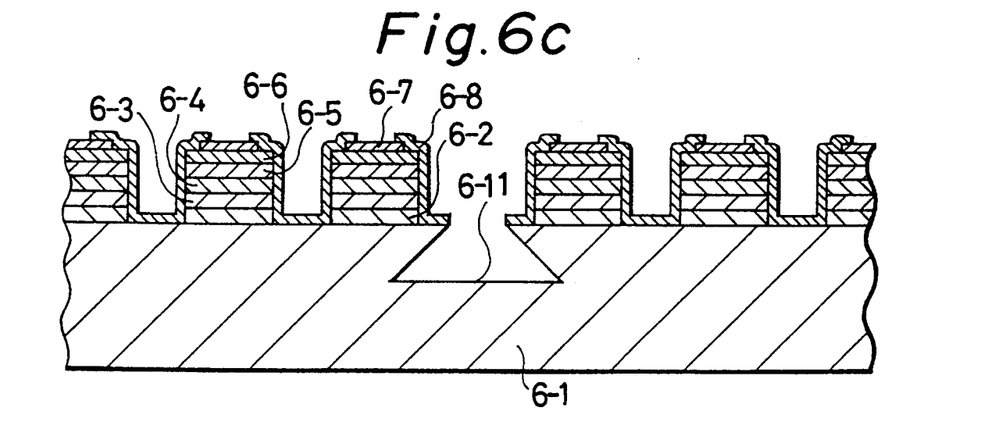
Figure 6D:
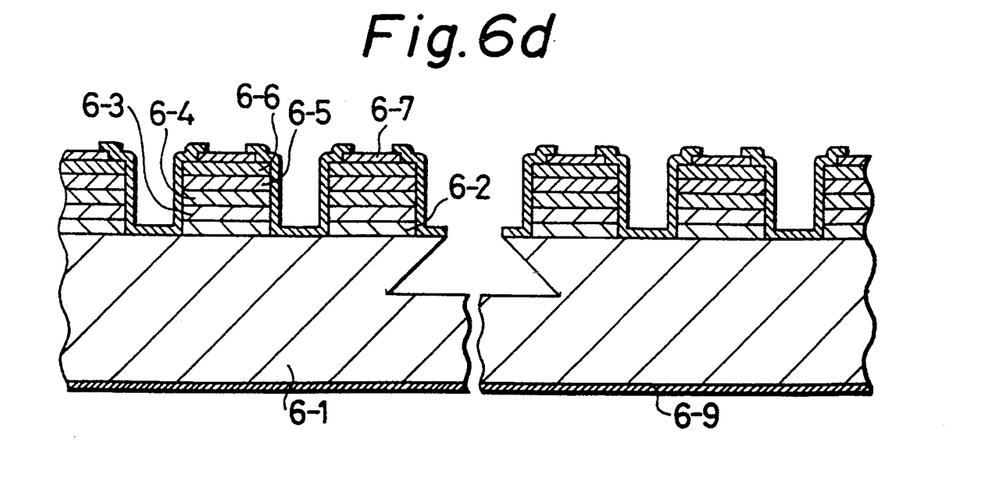

The fabricating method of the light emitting diode array in this third embodiment is basically similar to that in each of the first and second embodiments. The differences between the third embodiment and the first and second embodiments are that the Dovetail grooved mesa shape is formed by using the dry etching method. FIGS. 6a to 6d show this fabricating method. As shown in FIG. 6a, a double hetero structure is composed of an n-type GaAs buffer layer 6-2, an n-type $Al_{0.4}Ga_{0.6}As$ clad layer 6-3, an $Al_{0.2}Ga_{0.8}As$ active layer 6-4, a p-type $Al_{0.4}Ga_{0.6}As$ clad layer 6-5 and a p-type GaAs cap layer 6-6 sequentially formed on an n-type GaAs substrate 6-1. The double hetero structure composed of these five layers is epitaxially grown by a MOCVD method. As shown in FIG. 6b, a p-type electrode 6-7 composed of Au-Zn/Au is next formed. Thereafter, dry etching is then performed by using RIBE until a substrate surface to electrically separate elements from each other so that a separate groove 6-10 is formed. As shown in FIG. 6c, a passivation film 6-8 of $SiO_2$ having a thickness of 0.5 μm is then formed. This passivation film 6-8 is used as a mask and dry etching is performed. In this case, a method of this dry etching uses a radical etching method in which an etched shape depends on a crystal azimuth. In an etching condition, a chlorine gas pressure is set to $3 \times 10^{-3}$ Torr, a substrate temperature 300° C. and an etching time is set to 42 minutes. In this etching condition, a Dovetail groove 6-11 having a depth of 30 μm is formed. As shown in FIG. 6d, an n-type electrode 6-9 composed of Au-Ge/Ni/Au is next formed on a rear face of the n-type GaAs substrate 6-1. Thereafter, a bottom portion of the etched groove 6-11 is died to separate chips from each other in the light emitting diode array. In the light emitting diode array, a Dovetail grooved mesa shape of a light emitting portion can be formed by the dry etching method on a (100) face of the n-type GaAs substrate in a chip end portion in the light emitting diode array. For example, the light emitting diode array has a structure in which light emitting portions are formed with an equal clearance in a direction of <011>.

Embodiment 4

In a fourth embodiment of the present invention, a Dovetail grooved mesa shape is formed by using the dry etching method and the wet etching method. In this fourth embodiment, a length from a light emitting portion of the light emitting diode array to a chip end portion is very short. Accordingly, the fourth embodiment is especially effective when there is a problem that a substrate end portion is retreated backward by wet-etching. In this case, a shape and a function of the light emitting diode array in the present invention are similar to those in the above first embodiment. Accordingly, in the fourth embodiment, only a fabricating method of the light emitting diode array is shown in the following description when the Dovetail grooved mesa shape in the present invention is formed by using the dry etching method and the wet etching method.

Figure 7A:
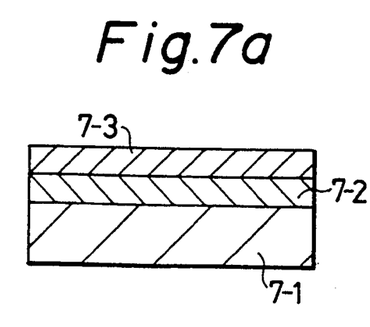
FIGS. 7a to 7e are views for explaining fabricating processes of a light emitting diode array in accordance with a fourth embodiment of the present invention.
Figure 7B:
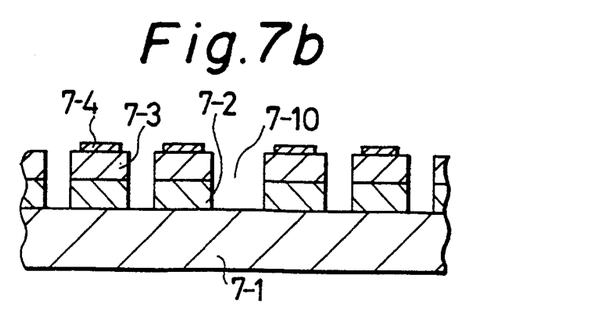
Figure 7C:
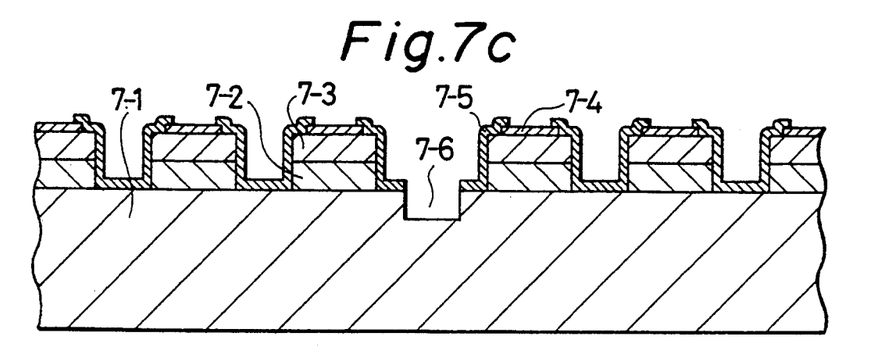
Figure 7D:
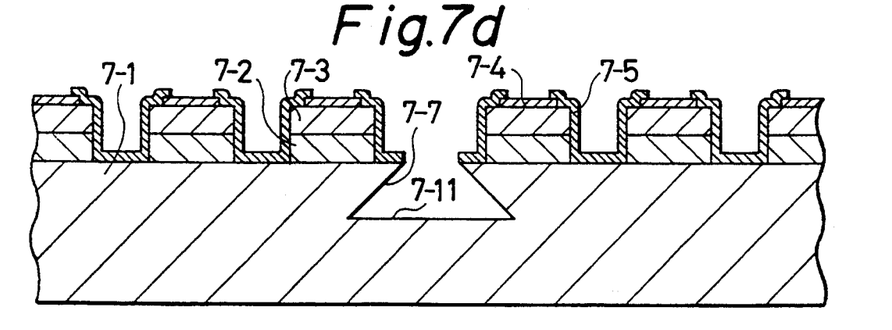
Figure 7E:
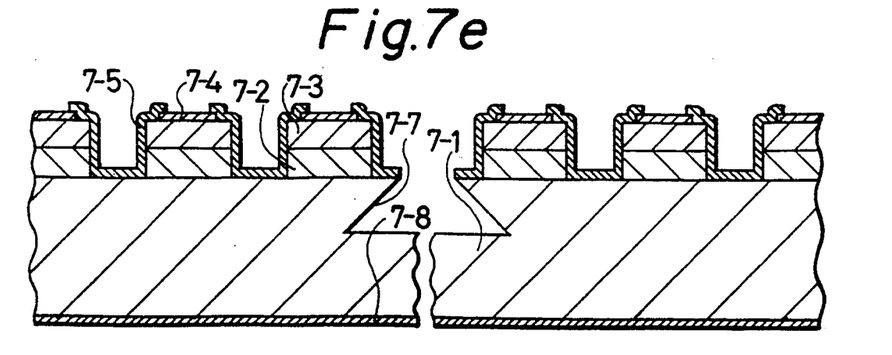

The fabricating method of the light emitting diode array in the fourth embodiment is basically similar to that in each of the above first, second and third embodiments. However, a method for forming the Dovetail grooved mesa shape in the fourth embodiment is different from that in each of the first, second and third embodiments. In this fourth embodiment, a vertical groove is first formed by using the dry etching method. Thereafter, the Dovetail grooved mesa shape in the present invention is formed by using the wet etching method. FIGS. 7a to 7e show this fabricating method. As shown in FIG. 7a, an n-type GaAs layer 7-2 and a p-type GaAs layer 7-3 are epitaxially grown on an n-type GaAs substrate 7-1 by an LPE method. As shown in FIG. 7b, a p-type electrode 7-4 composed of Au-Zn/Au is next formed. Thereafter, a separate groove 7-10 is formed by dry etching using, RIE until a substrate surface to electrically separate elements from each other. As shown in FIG. 7c, a passivation film 7-5 of SiO₂ having a thickness of 0.5 μm is then formed. This passivation film 7-5 is used as a mask and dry etching is performed. In this case, an etching groove 7-6 having a depth of 20 μm is formed by using a normal physical etching method using RIE. As shown in FIG. 7d, the passivation film 7-5 of SiO₂ is used as a mask and wet etching is performed for four minutes at a temperature of 7° C. by using an etching liquid composed of sulfuric acid, hydrogen peroxide and water having a ratio of 1:8:1. Thus, a Dovetail groove 7-7 having a depth of 30 μm is formed. As shown in FIG. 7e, an n-type electrode 7-8 composed of Au-Ge/Ni/Au is next formed on a rear face of the n-type GaAs substrate 7-1. Thereafter, a bottom portion 7-11 of the etched groove 7-7 is died to separate chips from each other in the light emitting diode array. In the light emitting diode array, the Dovetail grooved mesa shape of a light emitting portion can be formed on a (100) face of the n-type GaAs substrate in a chip end portion in the light emitting diode array by the wet etching after the dry etching. For example, the light emitting diode array has a structure in which light emitting portions are formed with an equal clearance in a direction of <011>.

Many widely different embodiments of the present invention may be constructed without departing from the spirit and scope of the present invention. It should be understood that the present invention is not limited to the specific embodiments described in the specification, except as defined in the appended claims.

What is claimed is:

1. A light emitting diode array having a plurality of light emitting diodes arranged in a line on a semiconductor substrate, wherein said semiconductor substrate has end faces in a direction perpendicular to an arranging direction of the light emitting diodes and a Dovetail grooved mesa shape on each of said end faces in a direction perpendicular to an arranging direction of the light emitting diodes.

2. A light emitting diode array as claimed in claim 1, wherein the Dovetail grooved mesa shape has an angle reflecting a crystal property.

3. A light emitting diode array as claimed in claim 1, wherein the Dovetail grooved mesa shape is simultaneously formed on each of the end faces in the direction perpendicular to the arranging direction of the light emitting diodes by one of a wet etching method and a dry etching method.

4. A light emitting diode array as claimed in claim 3, wherein a plurality of light emitting diode arrays arranged in a line are used for a light source for an optical printer.

5. A light emitting diode array as claimed in claim 2, wherein the Dovetail grooved mesa shape is formed in a direction of 011.

6. A light emitting diode array having a plurality of light emitting diodes arranged in a line on a semiconductor substrate, wherein said semiconductor substrate has end faces in a direction perpendicular to an arranging direction of the light emitting diodes and end faces in the arranging direction of the light emitting diodes, and a Dovetail grooved mesa shape on each of said end faces in a direction perpendicular to an arranging direction of the light emitting diodes and has a V grooved mesa shape on each of said end faces in the arranging direction of the light emitting diodes.

7. A light emitting diode array as claimed in claim 6, wherein the Dovetail grooved mesa shape on each of the end faces in the direction perpendicular to the arranging direction of the light emitting diodes and the V grooved mesa shape on each of the end faces in the arranging direction of the light emitting diodes are respectively formed simultaneously by one of a wet etching method and a dry etching method.

8. A light emitting diode array as claimed in claim 7, wherein a plurality of light emitting diode arrays arranged in a line are used for a light source for an optical printer.

9. A light emitting diode array as claimed in claim 6, wherein the Dovetail grooved mesa shape is formed by applying the wet etching method after the dry etching method is applied to the end faces in the direction perpendicular to the arranging direction of the light emitting diodes.

10. A light emitting diode array as claimed in claim 9, wherein the light emitting diodes are formed with an equal clearance in a direction of <011> on a substrate face of (100).

11. A light emitting diode array as claimed in claim 1, wherein a cutting length of the semiconductor substrate in the Dovetail grooved mesa shape is set independent of a length between a center portion of a light emitting diode adjacent to the end face and the end face, a length between center portions of light emitting diodes adjacent to each other, and a length between the end face and an edge of the light emitting diode adjacent to the end face.

12. A light emitting diode array as claimed in claim 6, wherein a cutting length of the semiconductor substrate in the Dovetail grooved mesa shape is set independent of a length between a center portion of a light emitting diode adjacent to the end face in the direction perpendicular to the arranging direction of the light emitting diodes and the end face in the direction perpendicular to the arranging direction of the light emitting diodes, a length between center portions of light emitting diodes adjacent to each other, and a length between the end face in the direction perpendicular to the arranging direction of the light emitting diodes and an edge of the light emitting diode adjacent to the end face in the direction perpendicular to the arranging direction of the light emitting diodes.

13. A light emitting diode array as claimed in claim 6, wherein the light emitting diode array is a high density type light emitting diode array.

14. A light emitting diode array as claimed in claim 6, wherein the light emitting diode array is an edge emitting type light emitting diode array.

15. A light emitting diode array as claimed in claim 1, wherein the light emitting diode array is a high density type light emitting diode array.

16. A light emitting diode array as claimed in claim 1, wherein the light emitting diode array is an edge emitting type light emitting diode array.

* * * * *